United States Patent
Hopkin

(10) Patent No.: US 11,508,930 B2
(45) Date of Patent: Nov. 22, 2022

(54) ULTRATHIN METAL ELECTRODE WITH AUXILIARY ELECTRODE FOR LIGHT-EMITTING DEVICE

(71) Applicant: SHARP KABUSHIKI KAISHA, Osaka (JP)

(72) Inventor: Hywel Hopkin, Oxford (GB)

(73) Assignee: SHARP KABUSHIKI KAISHA, Osaka (JP)

( * ) Notice: Subject to any disclaimer, the term of this patent is extended or adjusted under 35 U.S.C. 154(b) by 188 days.

(21) Appl. No.: 17/105,602

(22) Filed: Nov. 26, 2020

(65) Prior Publication Data

US 2022/0165978 A1 May 26, 2022

(51) Int. Cl.
*H01L 51/52* (2006.01)
*H01L 51/50* (2006.01)
*H01L 27/32* (2006.01)

(52) U.S. Cl.
CPC ...... *H01L 51/5212* (2013.01); *H01L 27/3246* (2013.01); *H01L 51/502* (2013.01); *H01L 51/5056* (2013.01); *H01L 51/5072* (2013.01); *H01L 51/5234* (2013.01)

(58) Field of Classification Search
CPC .................. H01L 51/5212; H01L 51/5234
See application file for complete search history.

(56) References Cited

U.S. PATENT DOCUMENTS 6,812,637 B2    11/2004  Cok et al.

OTHER PUBLICATIONS

U.S. Appl. No. 16/689,383 by Boardman et al., Sharp Laboratories of Europe, filed Nov. 20, 2019.
Bi et al. "Ultrathin Metal Films as the Transparent Electrode in ITO-Free Organic Optoelectronic Devices" Advanced Optical Materials, 2018, 1800778 doi:10.1002/adom.201800778.

*Primary Examiner* — Anthony Ho
(74) *Attorney, Agent, or Firm* — ScienBiziP, P.C.

(57) ABSTRACT

A light-emitting device having a first electrode, a second electrode, and an emissive layer (EML) in electrical contact with the first electrode and the second electrode. A charge transport layer (CTL) is positioned between the EML and the second electrode, with the second electrode being an ultrathin transparent metal layer of less than five nanometers, and including an auxiliary electrode metal grid formed by wet etching. The ultrathin transparent metal layer is positioned between the CTL and the auxiliary electrode metal grid, and the ultrathin metal layer is preferably a metal with an etchant selectivity such that it is unaffected by the wet etching of the auxiliary electrode.

20 Claims, 6 Drawing Sheets

ULTRATHIN METAL ELECTRODE WITH AUXILIARY ELECTRODE FOR LIGHT-EMITTING DEVICE

FIELD

The present disclosure generally relates to quantum dot light-emitting diodes (QLEDs), and more particularly, to a QLED device having an ultrathin metal electrode in combination with an auxiliary electrode to realize a highly conductive top electrode with high transparency for use in a top emitting display.

BACKGROUND

A common QLED device comprises, as a minimum, an electroluminescent quantum dot layer (e.g., an emissive layer (EML)) situated in between an anode and a cathode. Generally, there exists also an electron transport layer (ETL) between the cathode and the quantum dot layer, and a hole transport layer (HTL) between the quantum dot layer and the anode. The device may further comprise an electron injection layer (EIL) between the cathode and ETL, and a hole injection layer (HIL) between the HTL and anode.

A QLED device is said to be bottom emitting (BE) if the light is emitted through a substrate (e.g., a thin film transistor (TFT) substrate) on which the layers described above are formed. A QLED device is said to be top emitting (TE) if the light is emitted away from the substrate. A TE device may be considered a preferable structure compared to a BE structure which requires light to pass through the TFT substrate which may lead to a significant reduction in brightness. A QLED device may have the anode in contact with the substrate, and such a device is said to have a conventional or non-inverted structure. A QLED device may have the cathode in contact with the substrate, and such a device is said to have an inverted structure.

The current state of the art top emitting QLED (or Organic Light Emitting Diode (OLED)) device employs a semi-transparent thin metal layer such as a silver (Ag)/magnesium (Mg) alloy, typically having a thickness of around fifteen nanometers (nm). This type of electrode presents a trade-off in properties between optical transparency and electrical conductivity. The metal layer cannot be much thinner than fifteen nanometers before the conductivity drops too low. The metal layer cannot be much thicker than fifteen nanometers before the transparency is too low.

For example, semi-transparent Ag/Mg alloy electrodes typically have a transparency of approximately 50-60%, and a sheet resistance of 20 $\Omega sq^{-1}$. This sheet resistance provides sufficient conductivity to transport current across a display of up to around six inches (for example, a mobile phone, or similarly sized display). For larger displays, however, the voltage drop in such electrodes is too large, leading to unacceptable luminance variation across a larger display.

Quantum dots naturally have a narrower spectral emission profile than emissive layers OLEDs. Thus, the presence of a cavity, while beneficial for OLEDs, results in a significant color shift at wide viewing angles with QLEDs which is undesirable for such displays. Electrodes with lower reflectivity than the thin metal layer, for example, formed from transparent conducting oxides, can eliminate the optical cavity effects and enable high efficiency QLEDs with low color shift when viewed off angle.

In order to realize a transparent conductive electrode (ICE) QLED electrode that can be used for larger display sizes, an auxiliary wire grid can be used as a supplemental electrode to transport current to each of the sub-pixels in a display. The TCE can then spread that current evenly across each sub-pixel. In one related art apparatus, the TCE is a transparent nanoparticle layer such as an indium tin oxide nanoparticle (ITO NP) layer. ITO NPs may have transparencies of greater than 95%, which is very good for removing cavity effects and for high efficiency. Also, ITO NPs have a relatively high conductivity, enabling good spread of current across the sub-pixels. Since the auxiliary wire grid electrode exists only on the banks, the auxiliary wire grid electrode can be relatively thick.

While a transparent nanoparticle layer (such as an ITO NP layer) combined with an auxiliary wire grid electrode provides improved transparency and conductivity compared to the aforementioned fifteen nanometer Ag/Mg layer, such a nanoparticle layer may not be conductive enough to effectively spread current across an entire sub-pixel. Also, nanoparticle layers, which may be effective in terms of conductivity and transparency, often lack a suitable energy level alignment, resulting in poor efficiency devices.

CITATION LIST

U.S. Pat. No. 6,812,637 B2 to Cok et al., "OLED Display with Auxiliary Electrode", Eastman Kodak Company, published Nov. 2, 2004.

U.S. patent application Ser. No. 16/689,383 by Boardman et al., Sharp Laboratories of Europe, filed Nov. 19, 2019.

"Ultrathin Meal Films as the Transparent Electrode in ITO-Free Organic Optoelectronic Devices", Yan-Gang Bi et al., Advanced Optical Materials, 2019, https://onlinelibrary.wiley.com/doi/epdf/10.1002/adom.201800778.

SUMMARY

A light-emitting device includes a first electrode, a second electrode comprising an ultrathin metal layer, and an auxiliary electrode. An emissive layer (EML) is in electrical contact with the first electrode and the second electrode. A first charge transport layer (CTL) is positioned between the EML and the first electrode, and a second CTL is positioned between the EML and the second electrode. The EML is disposed between the first CTL, and the second CTL, and the ultrathin metal layer is disposed between the EML and the auxiliary electrode. The ultrathin metal layer comprises a metal unaffected by a formation and patterning of the auxiliary electrode.

Preferably, the ultrathin metal layer is greater than eighty five percent transparent, and the ultrathin metal layer has a thickness of 5 nanometers or less. In some implementations, the ultrathin metal layer may be a noble metal.

For QLED fabrication and patterning, it is desirable that a solution process is used, which is far less expensive than, for example, vacuum processing (as is used for OLEDs). Forming the auxiliary electrode by chemical wet-etch is an exemplary solution process. In one alternative implementation, the ultrathin metal layer may be a metal material chosen from the list of silver, gold, platinum, titanium, and chromium. In such an instance, the auxiliary electrode may be aluminum, and an aluminum etchant may be used for etching the auxiliary electrode. In another alternative implementation, the ultrathin metal layer may be a metal material chosen from the list of silver, chromium, and titanium. In such an instance, the auxiliary electrode may be gold, and an aqua regia etchant may be used for etching the auxiliary electrode.

In yet another alternative implementation, the ultrathin metal layer may be a metal material chosen from the list of nickel, chromium tin, platinum, and titanium. In such an instance, the auxiliary electrode may be copper, and a copper etchant may be used for etching the auxiliary electrode. And in another alternative implementation, the ultrathin metal layer may be aluminum. In such an instance, the auxiliary electrode may be gold or silver, and a potassium iodide ($KI/I_2$) aqueous solution may be used for etching the auxiliary electrode.

The ultrathin metal layer may also be an alloy of silver and platinum. The auxiliary electrode is preferably a wire grid, and the auxiliary may be aluminum. The EML may quantum dots. A seed layer may be placed between the second CTL and the ultrathin metal layer. The seed layer may be a metal oxide or another metal different from the ultrathin metal layer. Preferably the seed layer has a thickness of less than 1.5 nanometers. In one implementation, the seed layer may be made of a material chosen from the list of molybdenum oxide, tungsten oxide, and vanadium oxide.

The light-emitting device may also include a reflector, with the first electrode being positioned between the reflector and the first CTL, and the second CTL being positioned between the EML and the second electrode. In such an instance, the first electrode may be an anode electrode, with the first CTL being a hole transport layer (HTL) and the second CTL being an electron transport layer (ETL). Alternatively, the first electrode may be a cathode electrode, with the first CTL being an ETL; and the second CTL being an HTL.

The light-emitting device may also include bank structures separating the reflector, the first electrode, and the EML into a plurality of sub-pixels. In one implementation, the ultrathin metal layer may be a uniform layer covering the bank structures and the plurality of sub-pixels, and the auxiliary electrode may be aligned with the bank structures to cover only the bank structures.

In one implementation, the light-emitting device may include a first electrode, a second electrode, an emissive layer (EML) in electrical contact with the first electrode and the second electrode. A charge transport layer (CTL) is positioned between the EML and the second electrode, with the second electrode being an ultrathin transparent metal layer of less than five nanometers, and including an auxiliary electrode metal grid formed by wet etching. The ultrathin transparent metal layer is positioned between the CTL and the auxiliary electrode metal grid, and the ultrathin metal layer is preferably a metal unaffected by the wet etching of the auxiliary electrode.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

DESCRIPTION

Figure 1:
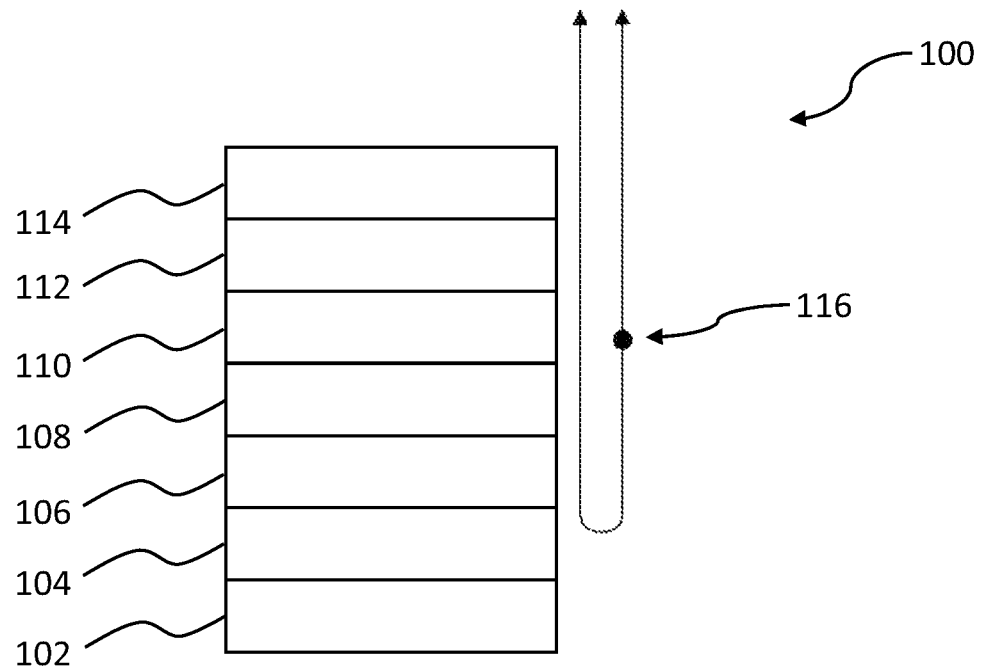
FIG. 1 illustrates a related art standard top emitting QLED structure.

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series and the equivalent.

Additionally, for purposes of explanation and non-limitation, specific details, such as functional entities, techniques, protocols, standards, and the like are set forth for providing an understanding of the described technology. In other examples, detailed description of well-known methods, technologies, system, architectures, and the like are omitted so as not to obscure the description with unnecessary details.

According to implementations of the present disclosure, an alternative transparent electrode structure is provided, the transparent electrode structure comprising an ultrathin metal cathode in combination with an auxiliary wire grid electrode. An ultrathin metal cathode with thickness less than 5 nm has high optical transparency and electrical conductivity comparable or better than those of transparent conductive nanoparticle layers. A metal can be chosen to have an energy level aligned with the charge transport layers of a QLED device.

Volmer-Weber mode or "islanding" can occur when ultra-thin metal layers are formed onto a surface which is detrimental to the conductivity of the film. Several techniques have been investigated[1] which can suppress Volmer-Weber mode, including doping the sputtering atmosphere with nitrogen, mixed metal sputtering and using a seed metal or metal oxide layer.

[1] Yan-Gang Bi et al. 2019—https://onlinelibrary.wiley.com/doi/epdf/10.1002/adom.201800778

In one implementation of the present disclosure, an ultra-thin metal electrode may comprise a metal seed layer such as gold, geranium or copper formed on the ETL, the metal seed layer having a thickness of around 1 nm. In another implementation of the present disclosure, the ultrathin metal cathode may comprise a 1 nm metal oxide seed layer such as a molybdenum oxide, tungsten oxide or vanadium oxide formed on the ETL. In yet another implementation of the present disclosure, the ultrathin metal cathode may comprise a combination of metals such as silver and platinum formed at the same time on the ETL.

In one implementation of the present disclosure, a wire grid may be formed on top of the transparent electrode using a wet etch process. To ensure that the ultrathin metal cathode (e.g., 5 nm) remains after the wet etch process, the metal is chosen to be resistant to the wet etch process. If the auxiliary electrode and transparent electrode are made of the same material, then it becomes very challenging to control the thickness of the transparent electrode. A key part of the present disclosure is therefore the use of orthogonal metals to form the transparent electrode and wire grid electrode. For the purposes of the present disclosure, an orthogonal metal is defined as one which can be processed without affecting a second metal that is present. A chemical etch process etches away a metal in areas where it is not protected by photoresist, and an orthogonal metal for this process is one which is resistant to the chemical etchant.

In one implementation of the present disclosure, when aluminum is used as the material for the wire grid electrode, a noble metal may be used as the ultrathin cathode as noble metals are resistant to aluminum etchant. In another implementation of the present disclosure, for an inverted QLED structure, platinum may be a suitable material for the ultra-thin metal anode as platinum is resistant to an aluminum wet etch and has an energy level comparable to common hole transport layers (HTLs). In yet another implementation of the present disclosure, for a non-inverted QLED structure, silver may be a suitable material for the ultrathin metal cathode as silver is resistant to an aluminum wet etch and has an energy level comparable to common electron transport layers (ETLs).

FIG. 1 illustrates a related art standard top emitting QLED structure 100. A TFT substrate layer 102 has a bottom reflector layer 104 formed thereon to reflect light away from the TFT 102. An anode electrode layer 106 is formed on the bottom reflector layer 104, and an HTL 108 is formed on the anode electrode layer 106. An EML 110 is formed on the HTL 108. An ETL 112 is formed on the EML 110, and a cathode electrode layer 114 is formed on the ETL 112.

When a voltage is applied to the standard top emitting QLED structure 100, light 116 emitted from the EML 110 toward the cathode electrode layer 114 exits the standard top emitting LED structure 100 directly while light 116 emitted toward the anode electrode layer 106 bounces off the bottom reflector layer 104 to exit the standard top emitting LED structure 100 in the same direction.

Figure 2:
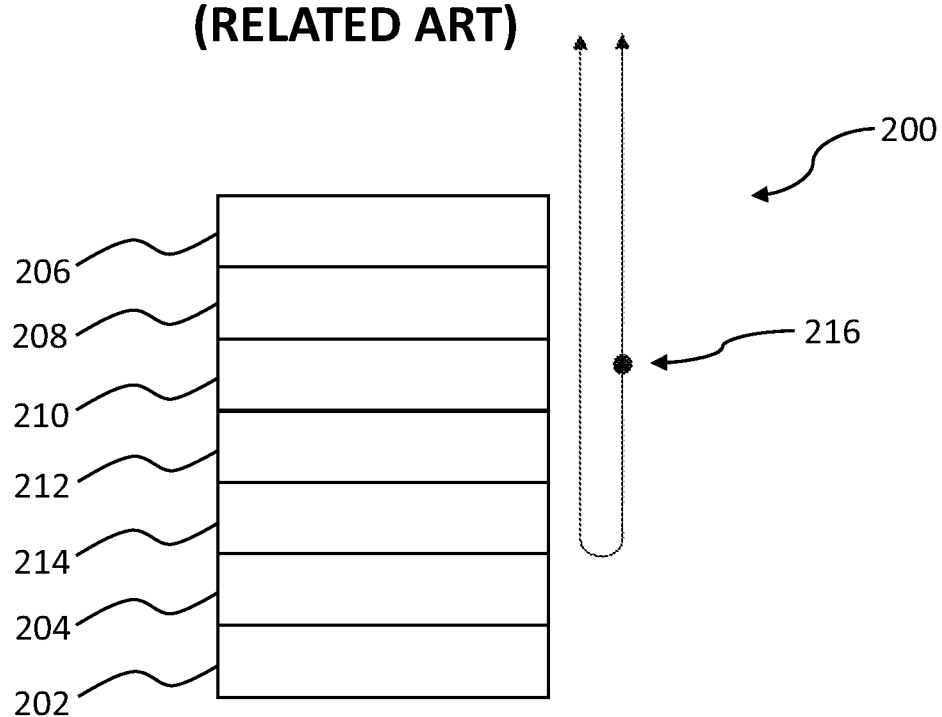
FIG. 2 illustrates a related art inverted top emitting QLED structure.

FIG. 2 represents a related art inverted top emitting QLED structure 200. Similar to the standard top emitting, QLED structure 100 in FIG. 1, a TFT substrate layer 202 has a bottom reflector layer 204 formed thereon to reflect light away from the TFT substrate layer 202. However, in the inverted structure, a cathode electrode layer 214 is formed on the bottom reflector layer 204, and an ETL 212 is formed on the cathode electrode layer 214. An EML 210 is formed on the ETL 212. An HTL 208 is formed on the EML 210, and an anode electrode layer 206 is formed on the HTL 208.

When a voltage is applied to the inverted top emitting QLED structure 200, light 216 emitted from the EML 210 toward the anode electrode layer 206 exits the inverted top emitting QLED structure 200 directly, while light 216 emitted toward the cathode electrode layer 214 bounces off the bottom reflector layer 204 to exit the inverted top emitting QLED structure 200 in the same direction.

Figure 3:
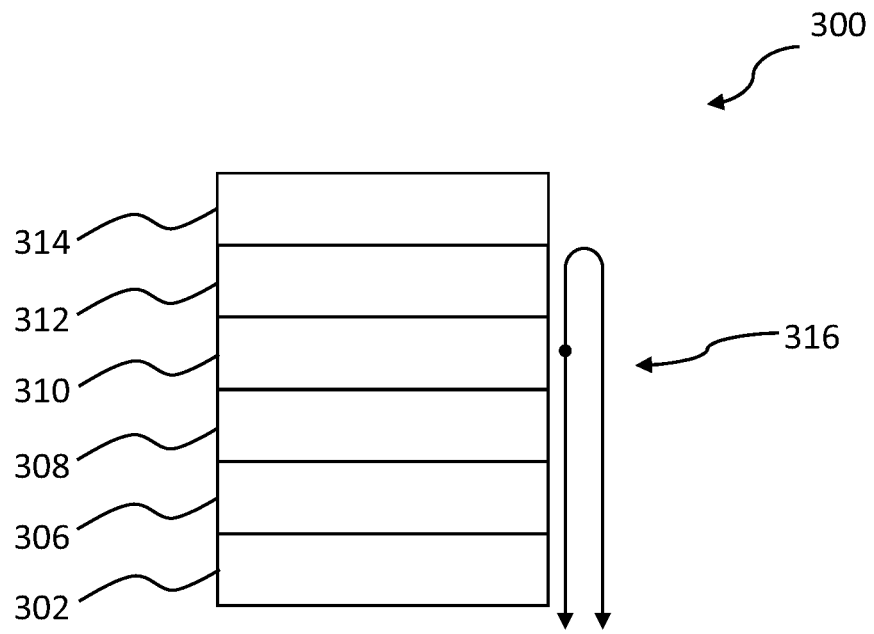
FIG. 3 illustrates a related art standard bottom emitting QLED structure.

FIG. 3 illustrates a related art standard bottom emitting QLED structure 300. A TFT substrate layer 302 has an anode electrode layer 306 formed directly thereon. An HTL 308 is formed on the anode electrode layer 306 and an EML 310 is formed on HTL 308. An ETL 312 is formed on the EML 310, and a cathode electrode layer 314 is formed on the ETL 312. The cathode electrode layer 314 is reflective to reflect light back toward the TFT substrate layer 302.

When a voltage is applied to the standard bottom emitting QLED structure 300, light 316 emitted from the EML 310 toward the anode electrode layer 306 exits the standard bottom emitting QLED structure 300 through the TFT substrate layer 302, while light 316 emitted toward the cathode electrode layer 314 bounces off the cathode electrode layer 314 to exit the standard bottom emitting QLED structure 300 in the same direction.

Figure 4:
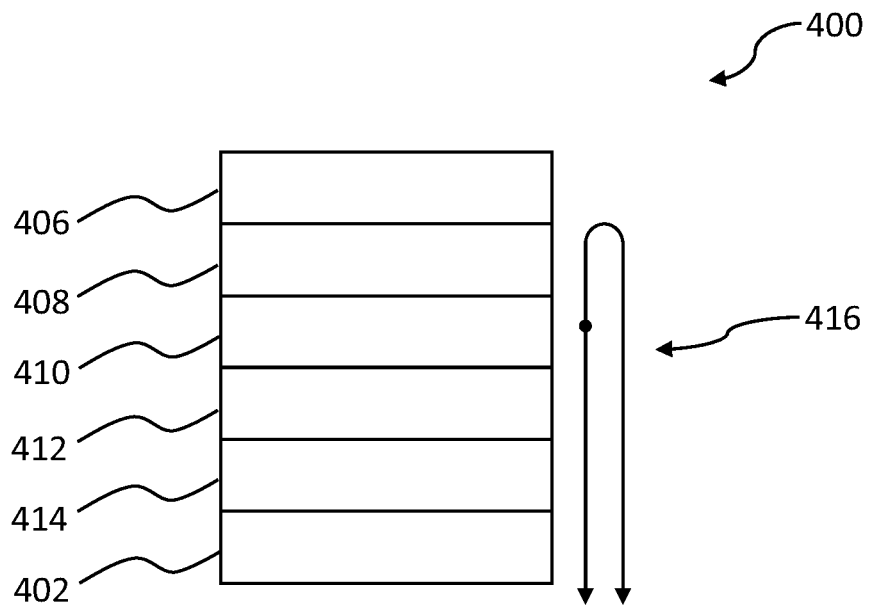
FIG. 4 illustrates a related art inverted bottom emitting QLED structure.

FIG. 4 illustrates a related art inverted bottom emitting QLED structure 400. In the inverted structure, a TFT substrate layer 402 has a cathode electrode layer 414 formed directly thereon. An ETL 412 is formed on the cathode electrode layer 414, and an EML 410 is formed on the ETL 412. An HTL 408 is formed on the EML 410, and an anode electrode layer 406 is formed on the HTL 408. The anode electrode layer 406 is reflective to reflect light back toward the TFT substrate layer 402.

When a voltage is applied to the inverted bottom emitting QLED structure 400, light 416 emitted from the EML 410 toward the cathode electrode layer 414 exits the inverted bottom emitting QLED structure 400 through the TFT substrate layer 402, while light 416 emitted toward the anode electrode layer 406 bounces off the anode electrode layer 406 to exit the inverted bottom emitting QLED structure 400 in the same direction.

Figure 5:
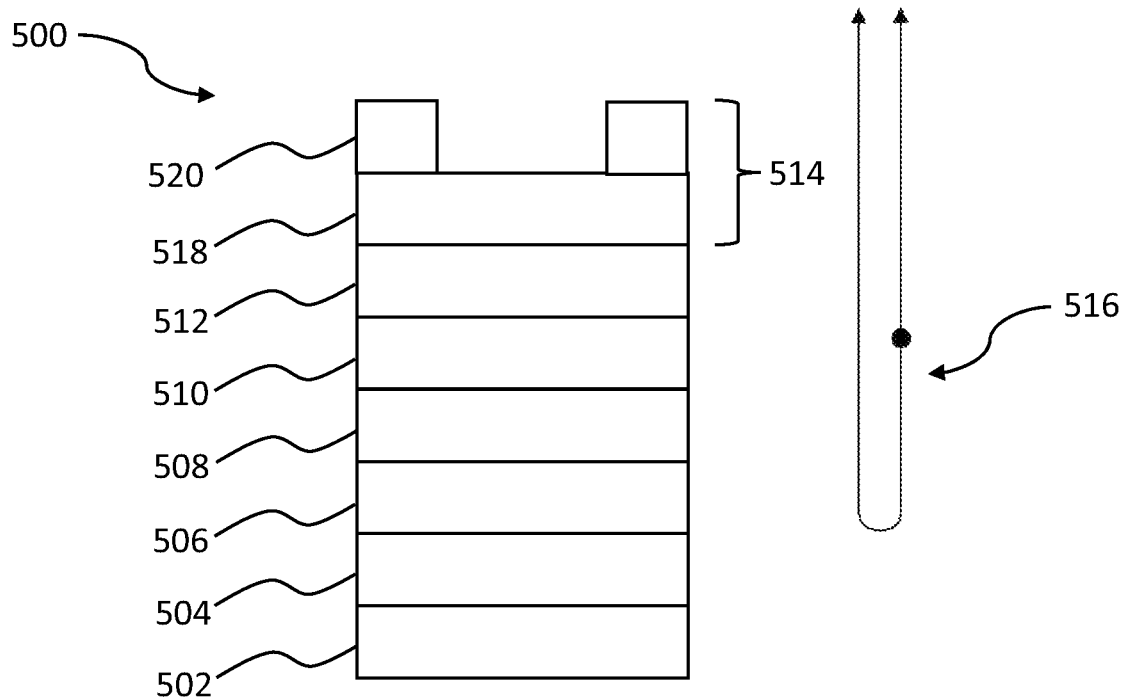
FIG. 5 illustrates a related art top emitting QLED having a transparent electrode and an auxiliary wire grid electrode.

FIG. 5 illustrates a related art top emitting QLED 500 having a transparent conductive electrode (ICE) layer 518 and an auxiliary wire grid electrode 520. The top emitting QLED 500 has a sub-pixel that can be used for larger display sizes. In the top emitting QLED 500, a TFT substrate layer 502 has a bottom reflector layer 504 formed on it to reflect light away from the TFT substrate layer 502. A first electrode layer 506 is formed on the bottom reflector layer 504, and a first CTL 508 is formed on the first electrode layer 506. An EML 510 is formed on the first CTL 508. A second CTL 512 is formed on the EML 510, and a second electrode layer 514 is formed on the second CTL 512.

In the top emitting QLED 500, the second electrode layer 514 comprises two independent electrode layers working in concert: the ICE layer 518 and the auxiliary wire grid electrode 520. The auxiliary wire grid electrode 520 is used to transport current to each sub-pixel in a larger display (not shown), and the TCE layer 518 spreads that current across individual sub-pixels. In one implementation, the ICE layer 518 may use a nanoparticle material such as indium-tin-oxide nanoparticles (ITO NPs). ITO NP layers can be fabricated with a transparency of greater than ninety five percent, with accompanying auxiliary wire grid electrodes being relatively thick, enabling good conductivity across the display. Using such nanoparticle electrodes may also provide protection to an EIL (in a standard structure), which can be damaged by wet etching; a process commonly used to form auxiliary wire grid electrodes.

It should be understood that the illustrated implementation of the top emitting QLED 500 can be either a standard device or an inverted device, i.e., the first electrode layer 506 may be an anode electrode layer or a cathode electrode layer, the second electrode layer 514 may be an anode electrode layer or a cathode electrode layer, the first CTL 508 may be an HTL or an ETL, and the second CTL 512 may be an HTL or an ETL. When a voltage is applied to the top emitting QLED 500, light 516 emitted from the EML 510 toward the second electrode layer 514 exits the top emitting QLED 500 directly, while light 516 emitted toward the first electrode layer 506 bounces off the bottom reflector layer 504 to exit the top emitting QLED 500 in the same direction.

Figure 6:
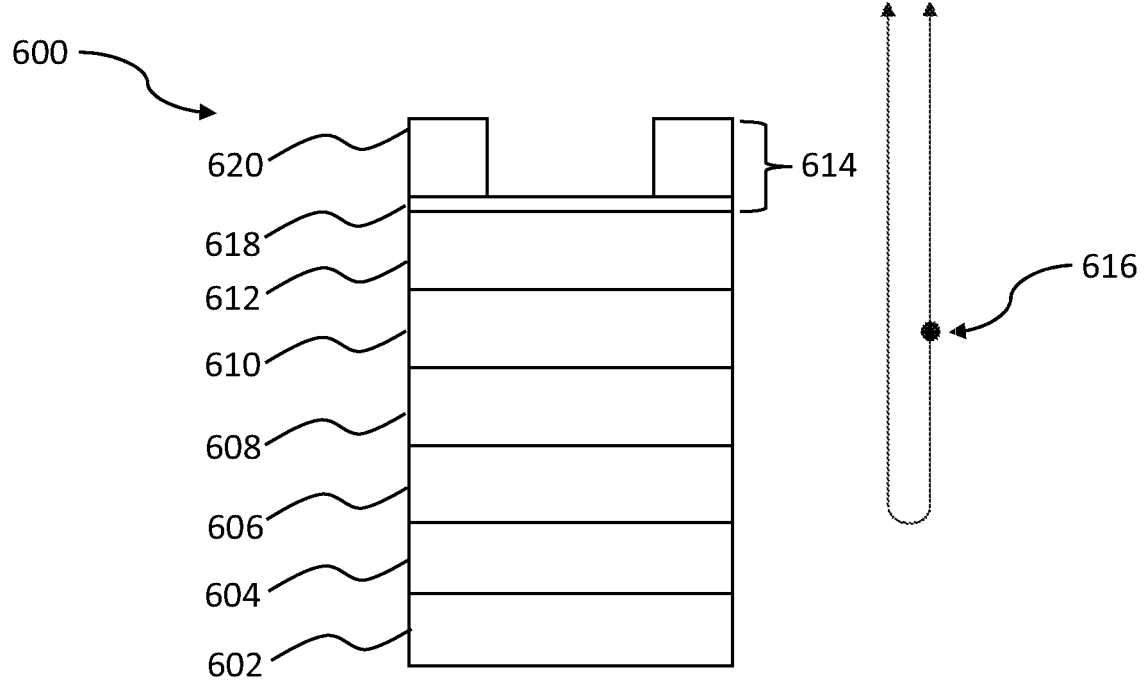
FIG. 6 illustrates a top emitting QLED stack having an ultrathin metal film and an auxiliary wire grid electrode in accordance with an implementation of the present disclosure.

FIG. 6 illustrates a top emitting ultrathin QLED stack 600 having an ultrathin metal film 618 and an auxiliary wire grid electrode 620 in accordance with an implementation of the present disclosure. In the present implementation, the top emitting ultrathin QLED stack 600 is an ultrathin QLED stack comprising a TFT substrate layer 602 with a bottom reflector layer 604 formed thereon to reflect light away from the TFT substrate layer 602. A first electrode layer 606 is formed on the bottom reflector layer 604, and a first CTL 608 is formed on the first electrode layer 606. An EML 610 is formed on the first CTL 608. A second CTL 612 is formed on the EML 610, and a second electrode layer is formed on the second CTL 612.

When a voltage is applied to the top emitting ultrathin QLED stack 600, light 616 emitted from the EML 610 toward the second electrode layer 614 exits the top emitting ultrathin QLED stack 600 directly, while light 616 emitted toward the first electrode layer 606 bounces off the bottom reflector layer 604 to exit the top emitting ultrathin QLED stack 600 in the same direction.

In this implementation, as with the top emitting QLED 500 shown in FIG. 5, the second electrode layer 614 comprises two electrode layers (the metal film TCE layer and the auxiliary wire grid). Unlike the top emitting QLED 500 which uses an ITO NP layer, a conductive ultrathin metal film 618 is used as the TCE layer with the auxiliary wire grid electrode 620. The ultrathin metal film 618 preferably has a thickness of less than five nanometers, and has both high optical transparency and electrical conductivity comparable or better than nanoparticle layers (such as the aforementioned ITO NP layer). Additionally, a metal may be chosen to have an energy level aligned with the charge transport layers of a QLED device.

When ultrathin metal layers are formed onto a surface, Volmer-Weber growth, or "islanding" of the ultrathin metal may occur on the surface. Islanding is detrimental to film conductivity because the metal atoms couple more strongly to each other than the surface, creating uneven surface characteristics and a non-uniform current distribution. Several techniques can suppress Volmer-Weber growth in the ultrathin metal. Thermal evaporation may be used, which is done under vacuum without the ability to dope the atmosphere. Alternatively, sputtering may be used, including doping the sputtering atmosphere, for example, with nitrogen. Mixed metal deposition or using seed layers are also techniques that can be used for depositing the metal. In one preferred implementation, the ultrathin metal film 618 comprises an approximately one nanometer metal seed layer such as gold, geranium or copper formed on the second CTL 612. In an alternative implementation, the ultrathin metal film 618 comprises an approximately one nanometer metal oxide seed layer such a molybdenum oxide, tungsten oxide or vanadium oxide formed on the second CTL 612. In yet another implementation, the ultrathin metal film 618 comprises a combination of metals such as silver and platinum formed at the same time on the second CTL 612.

Still referring to FIG. 6, the auxiliary wire grid electrode 620 may be formed on the transparent ultrathin metal film 618 using a wet etch process. If the auxiliary wire grid electrode 620 and ultrathin metal film 618 are made of the same material, it becomes very challenging to control the thickness of the ultrathin metal film 618. To ensure the ultrathin metal film 618 remains in place on the second CTL 612, with a desirable uniform thickness of less than five nanometers, after the wet etch process on the auxiliary wire grid electrode 620, a metal selectively resistant to the auxiliary wire grid electrode 620 wet etch process should be used. Specifically, the metal comprising the ultrathin metal film 618 should remain substantially unaffected by the wet etch process on the auxiliary wire grid electrode 620. Such etchant selectivity between two metals, for purposes discussion herein, are referred to as "orthogonal" metals.

A chemical etch process etches away the auxiliary wire grid electrode 620 metal in areas where it has not been protected by patterned photoresist. The ultrathin metal film 618, being resistant to the chemical etchant, remains unaffected by the process. For example, several noble metals, including silver (Ag), gold (Au), and platinum (Pt) are resistant to aluminum (Al) etchant, and thus those metals may be considered orthogonal to aluminum (Al). For an LED structure, if aluminum is used as the material for the auxiliary wire grid electrode 620, a suitable noble metal can be used for the ultrathin metal film 618.

In addition to being orthogonal to, for example, aluminum, it is also important that the metals used for the ultrathin metal film 618 match the energy level of the first CTL 608 or second CTL 612. For a standard QLED structure, silver may be a suitable material for the ultrathin metal cathode electrode since silver is resistant to an aluminum wet etch and has an energy level comparable to common ETLs. For an inverted QLED structure, platinum may be a suitable material for the ultrathin metal film 618 since platinum is resistant to an aluminum wet etch and has an energy level comparable to common HTLs.

Figure 7:
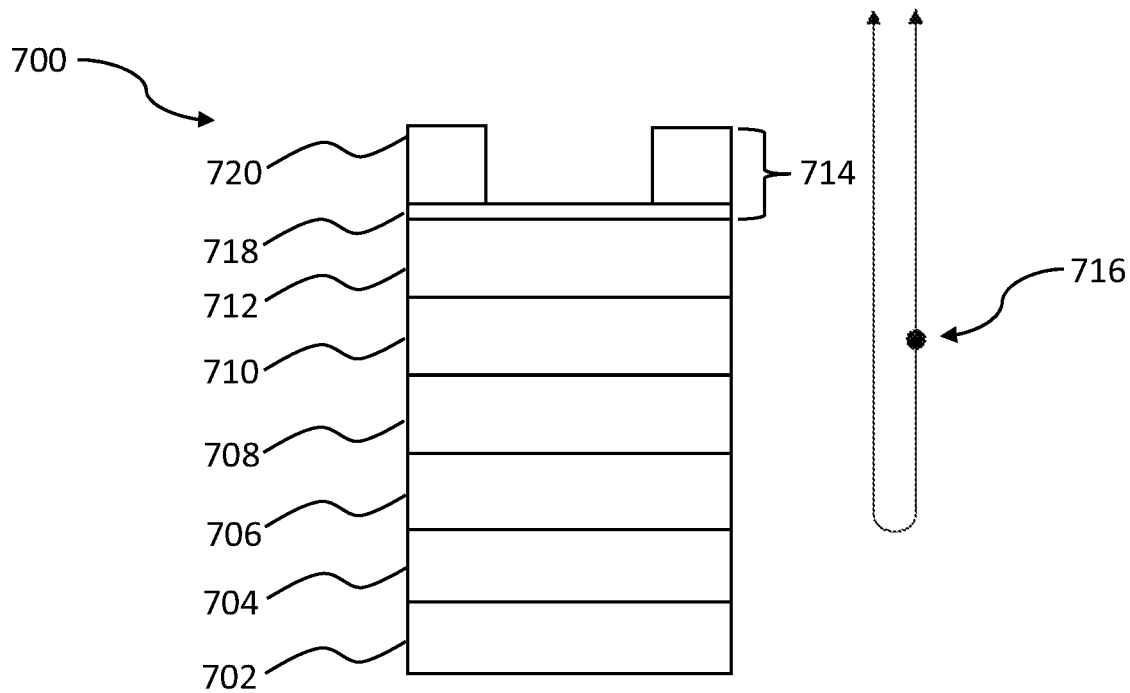
FIG. 7 illustrates a standard top emitting, QLED stack having, an ultrathin metal film and an auxiliary wire grid electrode in accordance with an implementation of the present disclosure.

FIG. 7 illustrates a standard (non-inverted) top emitting, ultrathin QLED stack 700 having an ultrathin metal film 718 and an auxiliary wire grid electrode 720 in accordance with an implementation of the present disclosure. A TFT substrate layer 702 has a bottom reflector layer 704 formed thereon to reflect light away from the TFT substrate layer 702. An anode electrode layer 706 is formed on the bottom reflector layer 704, and an HTL 708 is formed on the anode electrode layer 706. A quantum dot (QD) layer 710 is formed on the HTL 708. An ETL 712 is formed on the QD layer 710, and a cathode electrode layer 714, is formed on the ETL 712.

When a voltage is applied to the top emitting ultrathin QLED stack 700, light 716 emitted from the QD layer 710 toward the cathode electrode layer 714 exits the top emitting ultrathin QLED stack 700 directly, while light 716 emitted toward the anode electrode layer 706 bounces off the bottom reflector layer 704 to exit the top emitting ultrathin QLED stack 700 in the same direction.

Figure 8:
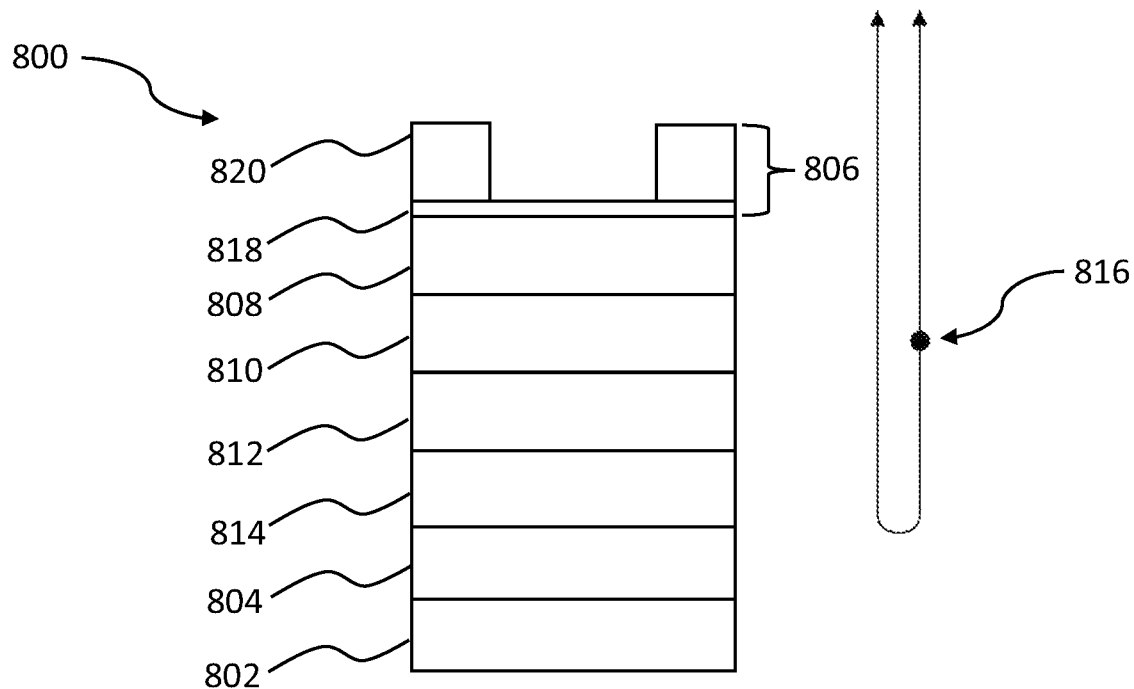
FIG. 8 illustrates an inverted top emitting QLED stack having an ultrathin metal film and an auxiliary wire grid electrode in accordance with an implementation of the present disclosure.

The cathode electrode layer 714 comprises for example an Ag ultrathin metal film 718 of preferably less than five nanometers iii thickness, and thus having a transparency of greater than ninety five percent. The cathode electrode layer 714 also comprises for example an Al auxiliary wire grid electrode 720 on the Ag ultrathin metal film 718. The Ag ultrathin metal film 718 has an energy level comparable to the ETL 712, and is orthogonal (as defined previously) to the Al auxiliary wire grid electrode 720, such that when the Al auxiliary wire grid electrode 720 is photo-masked and wet etched, the Ag ultrathin metal film remains substantially unaffected. 1611 FIG. 8 illustrates an inverted top emitting ultrathin QLED stack 800 having an ultrathin metal film 818 and an auxiliary wire grid electrode 820 in accordance with an implementation of the present disclosure. FIG. 8 represents an alternative implementation of the standard top emitting ultrathin QLED stack 700 illustrated in FIG. 7 where the top emitting ultrathin QLED stack 800 is also top emitting, but with an inverted LED structure. Similar to the top emitting ultrathin QLED stack 700 in F the top emitting ultrathin QLED stack 800 comprises a TFT substrate layer 802 with a bottom reflector layer 804 formed on it to reflect light away from the TFT substrate layer 802. Unlike the top emitting ultrathin QLED stack 700, a cathode electrode layer 814 is formed on the bottom reflector layer 804, acid an ETL 812 is formed on the cathode electrode layer 814. A QD layer 810 is formed on the ETL 812. An HTL 808 is formed on the QD layer 810, and an anode electrode layer 806, is formed on the HTL 808.

When a voltage is applied to the top emitting ultrathin QLED stack 800, light 816 emitted from the QD layer 810 toward the anode electrode layer 806 exits the top emitting ultrathin QLED stack 800 directly, while light 816 emitted toward the cathode electrode layer 814 bounces oft the bottom reflector layer 804 to exit the top emitting ultrathin QLED stack 800 in the same direction.

The anode electrode layer 806 comprises for example a Pt ultrathin metal film 818 of preferably less than five nanometers iii thickness, and thus having a transparency of greater than ninety five percent. The anode electrode layer 806 also comprises for example an Al auxiliary wire grid electrode 820 on the Pt ultrathin metal film 818. The Pt ultrathin metal film 818 has an energy level comparable to the HTL 808, and is orthogonal (as defined previously) to the Al auxiliary wire grid electrode 820, such that when the Pt auxiliary wire grid electrode 820 is photo-masked and wet etched, the Pt ultrathin metal film 818 remains substantially unaffected.

Table 1 shows exemplary etching metal/resilient metal pairs that can be used to form the ultrathin metal film and the auxiliary wire grid described in various implementations of the present disclosure.

TABLE 1

Resilient Metal and Etching Metal Pairs

| Resilient Metal | Etching Metal | Etchant |
| --- | --- | --- |
| Silver, gold, platinum, titanium, chromium | Aluminium | Aluminium etchant (Mixture of phosphoric, acetic and nitric acids) |
| Silver, chromium, titanium | Gold | Aqua regia (Mixture of nitric and hydrochloric acids) |
| Nickle, chromium, tin, platinum, titanium | Copper | Cu etch 200 UBM |
| Aluminium | Gold, Silver | KI/I$_2$ Aqueous solution |

In various implementations, different combinations of orthogonal metals having selective resilience to various etchants may be used. For example, the ultrathin metal layer may be made of silver, gold, platinum, titanium, or chromium, with the auxiliary electrode comprising aluminum, and an etchant comprising an aluminum etchant. Alternatively, the ultrathin metal layer may be made of silver, chromium, or titanium, with the auxiliary electrode comprising gold, and an etchant comprising aqua regia. In another implementation, the ultrathin metal layer may be nickel, chromium, tin, platinum, or titanium, with the auxiliary electrode comprising copper, and an etchant comprising copper etch 200 under-bump-metallization (UBM). In yet another implementation, the ultrathin metal layer may be made of aluminum, with the auxiliary electrode comprises gold or silver, and an etchant comprising potassium iodide (KI/I$_2$).

Figure 9:
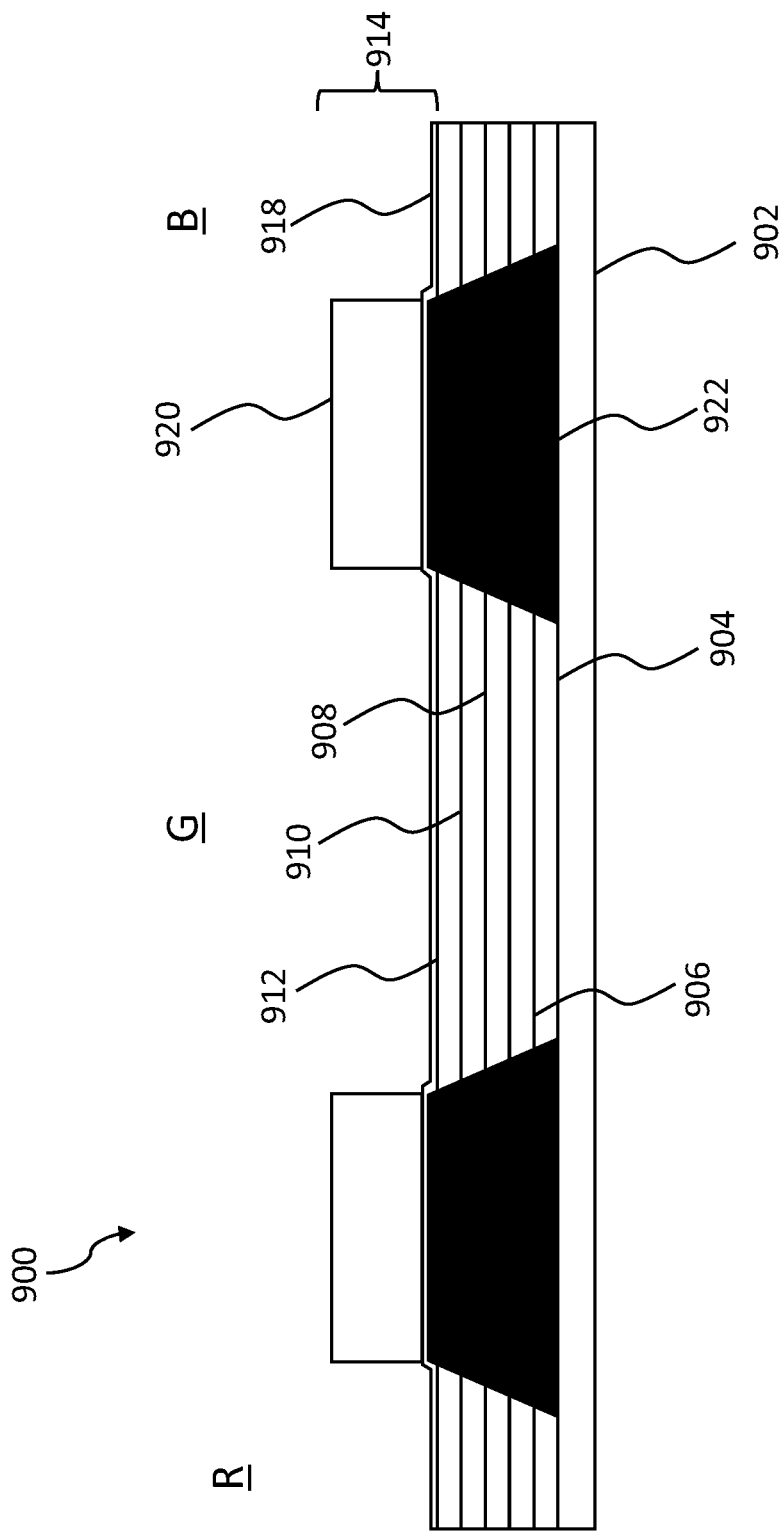
FIG. 9 illustrates a pixel structure of a top emitting QLED stack having an ultrathin metal film and an auxiliary wire grid electrode in accordance with an implementation of the present disclosure.

FIG. 9 illustrates a pixel structure 900 of a QLED display device having an ultrathin metal film 918 and an auxiliary wire grid electrode 920 in accordance with an implementation of the present disclosure. In FIG. 9, the pixel structure 900 may include a red-green-blue (RGB) full color pixel structure for a top emitting QLED display. The pixel structure 900 comprises a TFT substrate layer 902, with a bottom reflector layer 904 formed on the TFT substrate layer 902. A first electrode layer 906 is formed on the bottom reflector layer 904, and a first CTL 908 is formed on the first electrode layer 906. A light-emitting QD layer 910 is formed on the first CTL 908, aid a second CTL 912 is formed on the QD layer 910. A second electrode layer 914 is formed on the second CTL 912. The second electrode layer 914 comprises an ultrathin metal film 918, and an auxiliary wire grid electrode 920.

To create the RGB pixel structure 900, the patterned first electrode layer 906 (which may comprise the bottom reflector layer 904) is deposited on the TFT substrate layer 902. Bank structures 922 are then formed on the TFT substrate layer 902 between electrodes of the first electrode layer 906. The first CTL 908, the QD layer 910 and the second CTL 912 are then deposited. The bank structures 922 divide those layers into three differently colored sub-pixels (indicated as R, G, and B in FIG. 9), and help prevent cross-talk between them. The second electrode layer 914 comprises the ultrathin metal film 918, which is formed across all RGB sub-pixels, covering the top of the bank structures 922 as well as the light-emissive areas. The auxiliary wire grid electrode 920 covers the ultrathin metal film 918 over the bank structures 922.

To maximize luminance, the auxiliary wire grid electrode 920 is formed over the bank structures 922, without covering any RGB sub-pixels. In order to accomplish this, the auxiliary wire grid electrode 920 is protected by patterned photoresist in alignment with the bank structures 922, and exposed areas of the metal are then chemically etched. Portions of the material not forming the auxiliary wire grid electrode 920 (i.e., not covering the bank structures 922) are then washed away.

The RGB pixel structure 900 may be either standard or inverted. In a standard structure, the first electrode layer 906 is an anode electrode, with the first CTL 908 being an HTL, and the second CTL being an ETL. In a standard structure, the second electrode layer 914 is a cathode electrode, with the ultrathin metal film 918 comprising perhaps Ag and the auxiliary wire grid electrode 920 comprising perhaps Al for example. In an inverted structure, the first electrode layer 906 is a cathode electrode, with the first CTL 908 being an ETL, and the second CTL 912 being an HTL. In an inverted structure, the second electrode layer 914 is an anode electrode, with the ultrathin metal film 918 comprising perhaps Pt and the auxiliary wire grid electrode 920 comprising perhaps Al for example.

Figure 10:
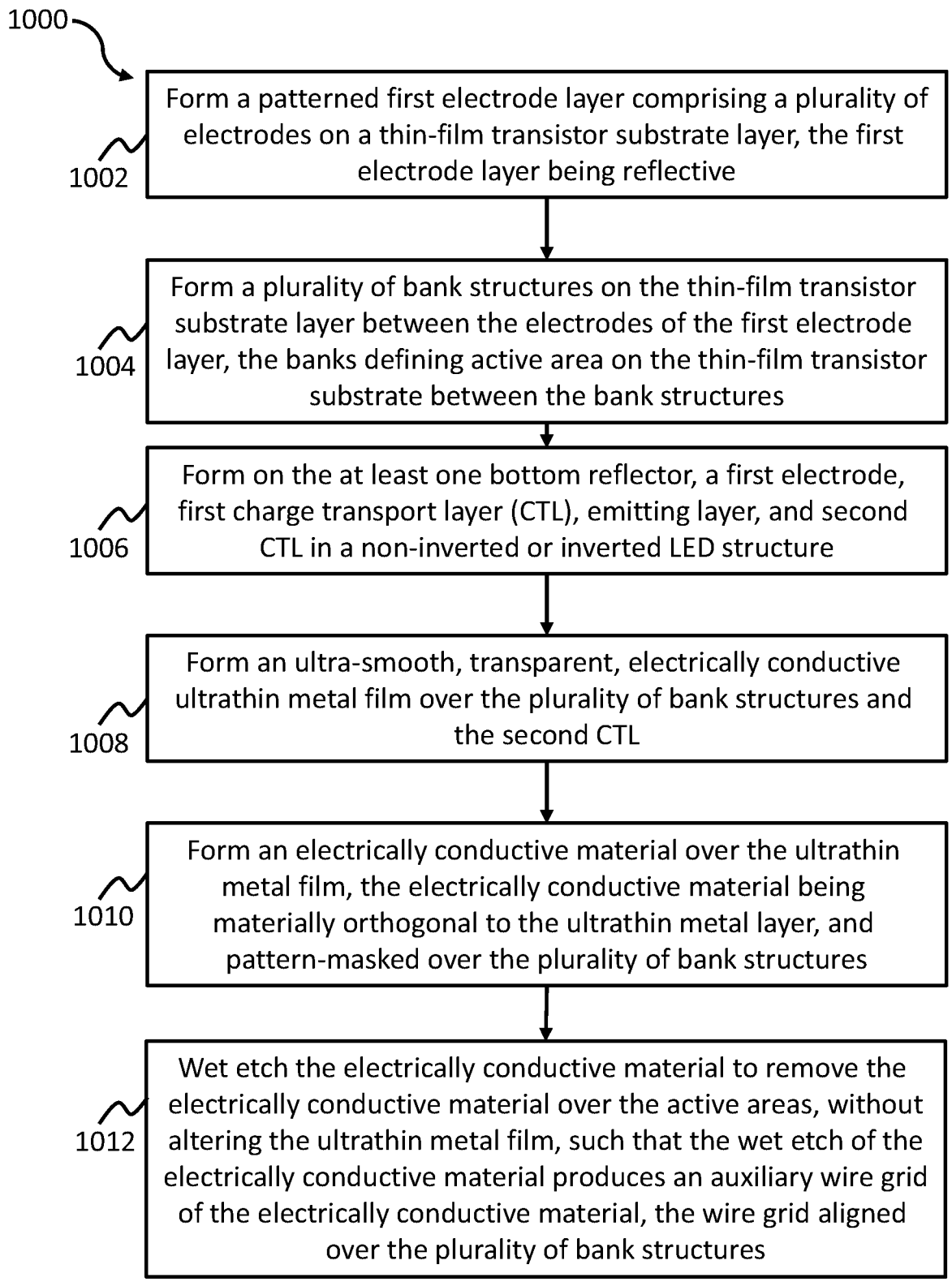
FIG. 10 illustrates a flowchart of a method for forming a QLED stack having an ultrathin metal film and an auxiliary wire grid electrode in accordance with an implementation of the present disclosure.

FIG. 10 illustrates a flowchart of a method 1000 for forming a QLED stack having an ultrathin metal film and an auxiliary wire grid electrode in accordance with an implementation of the present disclosure. In action 1002, a patterned first electrode layer comprising a plurality of electrodes is deposited on a thin film transistor substrate layer. The first electrode layer is preferably reflective. In action 1004, a plurality of bank structures are then formed on the TFT substrate layer between, and therefore separating, the electrodes of the first electrode layer, with the plurality of bank structures defining a plurality of active areas separated by the plurality of bank structures.

In action 1006, at least one bottom reflector, a first electrode, a first CTL, an emitting layer, and a second CTL are formed on the bottom reflective layer. The first electrode, first CTL, and second CTL may be arranged in a standard or inverted manner, to form a standard or inverted structure QLED. In a standard QLED structure, the first electrode would be an anode electrode, the first CTL air HTL, and the second CTL an ETL. In an inverted structure QLED, the first electrode would be a cathode electrode, the first CTL an ETL, and the second CTL an HTL.

In action 1008, an ultra-smooth, transparent, electrically conductive ultrathin metal film is formed over the plurality of bank structures and the second CTL. In action 1010, an electrically conductive material is formed over the ultrathin metal layer, the electrically conductive material being orthogonal to the ultrathin metal layer. The electrically conductive material is pattern-masked over the plurality of bank structures. In a standard QLED structure, the ultrathin metal film may be Ag, with an energy level comparable to an HTL, and in an inverted QLED structure, the ultrathin metal film may be Pt, with an energy level comparable to an ETL. In both instances, the electrically conductive material may be Al, which is orthogonal to Ag and Pt (and other noble metals).

In action 1012, the electrically conductive material is wet etched, removing the electrically conductive material over the active areas without altering the ultrathin metal film. The wet etch process produces an auxiliary wire grid of the electrically conductive material, the wire grid aligned over the plurality of bank structures. Removing the electrically conductive material over the active enables light to pass through the ultrathin metal film.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. For example, although implementation of the presence disclosure are described with reference to QLED devices, it should be understood that the same inventive concept can be applied to Organic LED (OLED) devices.

As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A light-emitting device, comprising:
a first electrode;
a second electrode comprising an ultrathin metal layer and an auxiliary electrode;
an emissive layer (EML) in electrical contact with the first electrode and the second electrode;
a first charge transport layer (CTL) between the EML and the first electrode; and
a second CTL between the EML and the second electrode;
wherein the EML is disposed between the first CTL and the second CTL;
wherein the ultrathin metal layer is disposed between the EML and the auxiliary electrode; and
wherein the ultrathin metal layer comprises a metal unaffected by a formation and patterning of the auxiliary electrode.

2. The light-emitting device of claim 1, wherein the ultrathin metal layer is greater than eighty five percent transparent.

3. The light-emitting device of claim 1, wherein the ultrathin metal layer has a thickness of 5 nanometers or less.

4. The light-emitting device of claim 1, wherein the ultrathin metal layer comprises a noble metal.

5. The light-emitting device of claim 1, wherein:
the ultrathin metal layer comprises a material chosen from the list of silver, gold, platinum, titanium, and chromium; and
the auxiliary electrode comprises aluminum, and an etchant comprising aluminum etchant is used for etching the auxiliary electrode.

6. The light-emitting device of claim 1, wherein:
the ultrathin metal layer comprises a material chosen from the list of silver, chromium, and titanium; and
the auxiliary electrode comprises gold, and an etchant comprising aqua regia etchant is used for etching the auxiliary electrode.

7. The light-emitting device of claim 1, wherein:
the ultrathin metal layer comprises a material chosen from the list of nickel, chromium tin, platinum, and titanium; and
the auxiliary electrode comprises copper, and an etchant comprising copper etchant is used for etching the auxiliary electrode.

8. The light-emitting device of claim 1, wherein:
the ultrathin metal layer comprises aluminum; and
the auxiliary electrode comprises gold or silver, and an etchant comprising potassium iodide ($KI/I_2$) aqueous solution is used for etching the auxiliary electrode.

9. The light-emitting device of claim 1, wherein the ultrathin metal layer comprises an alloy of silver and platinum.

10. The light-emitting device of claim 1, wherein the auxiliary electrode comprises a wire grid.

11. The light-emitting device of claim 1, wherein the EML comprises quantum dots.

12. The light-emitting device of claim 1, further comprising a seed layer between the second CTL and the ultrathin metal layer.

13. The light-emitting device of claim 12, wherein the seed layer comprises a metal oxide or a metal different from the ultrathin metal layer.

14. The light-emitting device of claim 12, wherein the seed layer has a thickness of less than 1.5 nanometers.

15. The light-emitting device of claim 1, further comprising a reflector, wherein the first electrode is disposed between the reflector and the first CTL, and the second CTL is disposed between the EML and the second electrode.

16. The light-emitting device of claim 15, wherein:
the first electrode is an anode;
the first CTL is a hole transport layer (HTL); and
the second CTL is an electron transport layer (ETL).

17. The light-emitting device of claim 15, wherein:
the first electrode is a cathode;
the first CTL is an electron transport layer (ETL); and
the second CTL is a hole transport layer (HTL).

18. The light-emitting device of claim 15, further comprising a reflector and bank structures separating the reflector, the first electrode, and the EML into a plurality of sub-pixels.

19. The light-emitting device of claim 18, wherein:
the ultrathin metal layer comprises a uniform layer covering the bank structures and the plurality of sub-pixels; and
the auxiliary electrode is aligned with the bank structures to cover only the bank structures.

20. A light-emitting device, comprising:
a first electrode;
a second electrode;
an emissive layer (EML) in electrical contact with the first electrode and the second electrode; and
a charge transport layer (CTL) between the EML and the second electrode;
wherein the second electrode comprises an ultrathin transparent metal layer of less than 5 nanometers, and an auxiliary electrode metal grid formed by wet etching;
wherein the ultrathin transparent metal layer is disposed between the CTL and the auxiliary electrode metal grid; and
wherein the ultrathin metal layer comprises a metal unaffected by the wet etching of the auxiliary electrode.

\* \* \* \* \*